(12) United States Patent
Hoffman et al.

(10) Patent No.: US 12,213,364 B2
(45) Date of Patent: Jan. 28, 2025

(54) TRIAD SUB-PIXEL ARRANGEMENTS FOR UNDER DISPLAY SENSORS

(71) Applicant: Google LLC, Mountain View, CA (US)

(72) Inventors: David Morris Hoffman, Fremont, CA (US); Ion Bita, Santa Clara, CA (US); Sangmoo Choi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/556,306

(22) Filed: Dec. 20, 2021

(65) Prior Publication Data

US 2023/0200172 A1 Jun. 22, 2023

(51) Int. Cl.
*H10K 59/35* (2023.01)
*H10K 59/131* (2023.01)

(52) U.S. Cl.
CPC ......... *H10K 59/353* (2023.02); *H10K 59/131* (2023.02)

(58) Field of Classification Search
CPC .......................................... H10K 59/351–353
See application file for complete search history.

(56) References Cited

U.S. PATENT DOCUMENTS

| | | | |
|---|---|---|---|
| 2019/0310724 A1 | 10/2019 | Yeke Yazdandoost et al. | |
| 2021/0065625 A1* | 3/2021 | Wang | H10K 59/35 |
| 2021/0134892 A1 | 5/2021 | Hwang et al. | |
| 2021/0159281 A1* | 5/2021 | Kim | C23C 14/042 |
| 2021/0376033 A1* | 12/2021 | Chae | H10K 59/126 |
| 2022/0068830 A1* | 3/2022 | Lee | H10K 59/122 |
| 2022/0115454 A1* | 4/2022 | Ko | H10K 59/352 |

FOREIGN PATENT DOCUMENTS

| | | |
|---|---|---|
| CN | 112002749 | 9/2020 |
| WO | WO 2020243740 | 12/2020 |

OTHER PUBLICATIONS

Lee et al., "34-4: Proposal of a New Resolution Representation for Several Pixel Arrangements." SID Symposium Digest of Technical Papers. vol. 52. No. 1. May 2021, 462-464.

* cited by examiner

*Primary Examiner* — Eric K Ashbahian
(74) *Attorney, Agent, or Firm* — Fish & Richardson P.C.

(57) ABSTRACT

In general, the subject matter described in this disclosure can be embodied in a display panel. The display panel includes a first area of multiple pixels that has a first density of light emitting diodes (LEDs), and that has an equal representation of LEDs of a first color, a second color, and a third color. Each pixel in the first area has: (i) a first sub-pixel comprising an LED of the first color, (ii) a second sub-pixel comprising an LED of the second color, and (iii) a third sub-pixel comprising an LED of the third color. The display panel includes a second area of multiple pixels that borders the first area, that has a second density of LEDs that is lower than the first density, and that has an unequal representation of LEDS of the first color, the second color, and the third color.

14 Claims, 6 Drawing Sheets

TRIAD SUB-PIXEL ARRANGEMENTS FOR UNDER DISPLAY SENSORS

BACKGROUND

Electronic devices include those with both sensors and displays.

SUMMARY

This document describes techniques, methods, systems, and other mechanisms for a display panel having two areas with different sub-pixel arrangements. Some Organic Light Emitting Diode (OLED) mobile phone displays utilize a sub-pixel arrangement in which there are fewer than three sub-pixels per logical pixel of the nominal display resolution.

A family of display device pixel arrangements, sometimes referred to as Pentile, make use of two sub-pixels per pixel. In such an arrangement, one of those sub-pixels can always be green. Thus, an image presented by a display device with such a pixel arrangement can have a full density of green sub-pixels, and 50% the density of red sub-pixels and blue sub-pixels. In an under-display sensor region of the display, some of the sub-pixels may be omitted by not patterning select metal layers to create a transparent window in a region.

Providing a greater density of green sub-pixels, in comparison to red sub-pixels and blue sub-pixels, is based on an elevated luminance efficiency of green to the human visual system. Thus, details represented using green sub-pixels can be more likely to be perceptible than those same details in red or blue. Additionally, the visual sensitivity to detailed color deviations is lower than it is for luminance.

It may be desirable to maximize the display area by moving certain components that typically were positioned at a bezel, to the side of a display of a computing device, to behind the display's active area. In order to increase light transmission through the display for optical sensing and/or imaging applications, some of the pixels that would otherwise be present in front of an optical sensor can be replaced with an open aperture.

Although three sub-pixel per pixel display panels can be less common for OLED mobile phones (e.g., due to high pixel pitch), three sub-pixel per pixel display panels remain popular for other form factors including smartwatches, TVs, and monitors. Display panels that include three sub-pixels per pixel can include such pixels in the historically-popular stripe arrangement in which there are three parallel elongated sub-pixels per pixel, or in a more-modern arrangement in which there may be other arrangements that use three sub-pixels (e.g., red, green, and blue (RGB)) to represent each logical pixel. In such a RGB triplet display, there may be advantages to use a Pentile-like structure with two sub-pixels per logical pixel (in which there are more green subpixels across a region than red or blue subpixels) to open up greater aperture space for transmission of electromagnetic energy to and from an under-display sensor, while avoiding a screen door effect.

In general, one innovative aspect of the subject matter described in this specification can be embodied in a display panel that includes a first area of multiple pixels that has a first density of light emitting diodes (LEDs), and that has an equal representation of LEDs of a first color, LEDs of a second color, and LEDs of a third color, with each pixel in the first area of multiple pixels having: (i) a first sub-pixel including an LED of the first color, (ii) a second sub-pixel including an LED of the second color, and (iii) a third sub-pixel including an LED of the third color; and a second area of multiple pixels that borders the first area of multiple pixels, that has a second density of LEDs that is lower than the first density of LEDs, and that has an unequal representation of LEDS of the first color, LEDs of the second color, and LEDs of the third color.

Other embodiments of this aspect include corresponding circuitry, computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

These and other embodiments can each optionally include one or more of the following features. In some aspects, the first area of multiple pixels completely surrounds the second area of multiple pixels. In certain aspects, the second area of multiple pixels includes at least fifty pixels. In some implementations, the first color is a red color, the second color is a blue color, and the third color is a green color.

In some aspects, the display panel forms a grid of pixel-sized regions, all pixel-sized regions within the first area are filled by the multiple pixels of the first area, and a subset of pixel-sized regions within the second area are filled by the multiple pixels of the second area, such that some pixel-sized regions within the second area include no LED. In certain aspects, the second area of multiple pixels has two LEDs of the third color for every LED of the first color and every LED of the second color. In some implementations, the third color is a green color. In some aspects, the first color is a red color and the second color is a blue color.

In some implementations, the second area of multiple pixels includes a first collection of pixels, with each pixel in the first collection of pixels having: (i) a first sub-pixel including an LED of the first color, (ii) a second sub-pixel including an LED of the second color, and (iii) a third sub-pixel including an LED of the third color; and a second collection of pixels, with each pixel in the second collection of pixels having: (i) a sub-pixel including an LED of the third color, (ii) without any LED of the first color, and (iii) without any LED of the second color. In certain aspects, the second area of multiple pixels has no pixel-sized region that is without any LED, such that all pixel-sized regions in the second area of multiple pixels has a pixel from the first collection of pixels or the second collection of pixels. In some aspects, an amount of pixels within the first collection of pixels corresponds to an amount of pixels within the second collection of pixels.

In some implementations, the second area of multiple pixels includes a collection of pixel-sized regions that are each without any LED. In certain aspects, the second area of multiple pixels includes: a first collection of pixels, with each pixel in the first collection of pixels having: (i) a first sub-pixel including an LED of the first color, and (ii) a second sub-pixel including an LED of the third color, (iii) without any LED of the second color; and a second collection of pixels, with each pixel in the second collection of pixels having: (i) a first sub-pixel including an LED of the second color, and (ii) a second sub-pixel including an LED of the third color, (iii) without any LED of the first color.

In some aspects, the second area of multiple pixels includes: a first collection of pixels, with each pixel in the first collection of pixels having: (i) a sub-pixel including an LED of the first color, (ii) without any LED of the second color, and (iii) without any LED of the third color; a second collection of pixels, with each pixel in the second collection of pixels having: (i) a sub-pixel including an LED of the second color, (ii) without any LED of the first color, and (iii) without any LED of the third color; and a third collection of pixels, with each pixel in the third collection of pixels having: (i) a sub-pixel including an LED of the third color, (ii) without any LED of the first color, and (iii) without any LED of the second color.

In some implementations, an amount of pixels within the first collection of pixels corresponds to an amount of pixels within the second collection of pixels; and an amount of pixels within the third collection of pixels corresponds to twice the amount of pixels within the first collection of pixels and twice the amount of pixels within the second collection of pixels. In certain aspects, a sensor is located underneath the second area of multiple pixels to receive or transmit electromagnetic energy through the second area of multiple pixels.

In general, one innovative aspect of the subject matter described in this specification can be embodied in an electronic device, including display panel including a first area of multiple pixels that has a first density of light emitting diodes (LEDs), and that has an equal representation of LEDs of a red color, LEDs of a blue color, and LEDs of a green color, with each pixel in the first area of multiple pixels having: (i) a first sub-pixel including an LED of the red color, (ii) a second sub-pixel including an LED of the blue color, and (iii) a third sub-pixel including an LED of the green color; and a second area of multiple pixels that borders the first area of multiple pixels on at least two sides, that has a second density of LEDs that is lower than the first density of LEDs, and that has an unequal representation of LEDS of the red color, LEDs of the blue color, and LEDs of the green color, due to an amount of LEDs of the green color corresponding to twice an amount of LEDs of the red color and twice an amount of LEDs of the blue color; and a sensor located underneath the second area of multiple pixels to receive or transmit electromagnetic energy through the second area of multiple pixels. In certain aspects, the second area of multiple pixels includes at least fifty pixels.

Details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
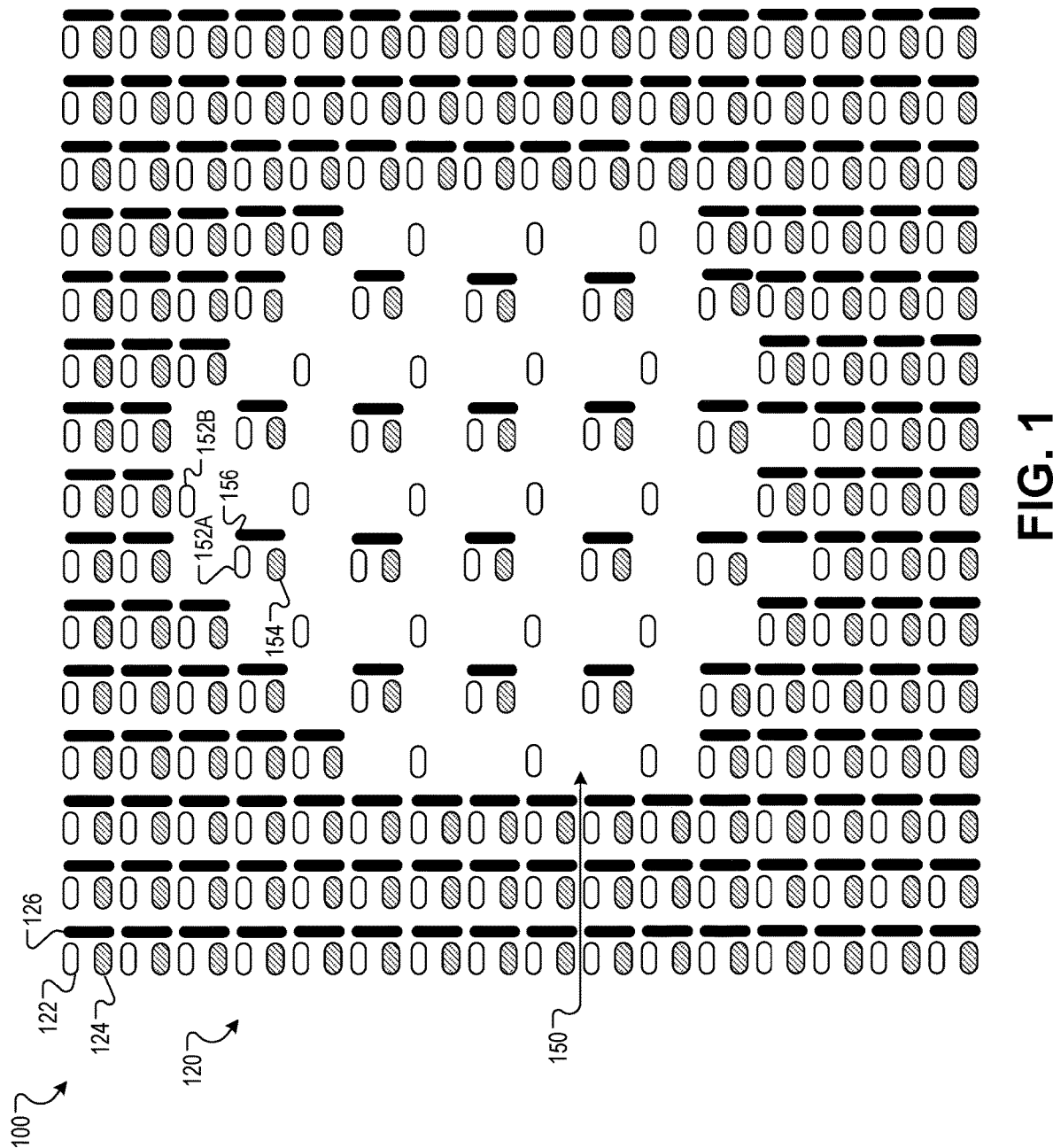
FIG. 1 is a conceptual diagram of a display panel having two areas with different sub-pixel arrangements.

FIG. 1 is a conceptual diagram of a display panel 100 having two areas with different, respective arrangements of sub-pixels. The display panel 100 defines a grid of pixel-sized regions, most of which include pixels with one or more constituent sub-pixels. For example, the display panel 100 includes an array with sixteen rows and fifteen columns of pixel-sized regions. The display panel 100 includes a first area 120 of multiple pixels and a second area 150 of multiple pixels. In some implementations, the first area 120 completely surrounds the second area 150. For example, the second area 150 may be circular and surrounded by the first area 120.

Each of the pixels in the first area 120 of multiple pixels has a single sub-pixel of a first color 124, a single sub-pixel of a second color 126, and a single sub-pixel of a third color 122. The sub-pixel of the first color 124 includes an LED of the first color and circuitry (e.g., transistors, a capacitor, and connecting traces) to receive a programmed intensity level and drive the LED to emit light at the programmed intensity level. The sub-pixel of the second color 126 includes an LED of the second color and circuitry to receive a programmed intensity level and drive the LED to emit light at the programmed intensity level. The sub-pixel of the third color 122 includes an LED of the third color and circuitry to receive a programmed intensity level and drive the LED to emit light at the programmed intensity level. The first area 120 may have an equal representation of LEDs of the first color, LEDs of the second color, and LEDs of the third color.

In some implementations, the first color may be red, the second color may be blue, and the third color may be green. For example, the pixel in the upper left corner of the display panel 100 includes a single red sub-pixel (e.g., a sub-pixel that has a red color), a single blue sub-pixel (e.g., a sub-pixel that has a blue color), and a single green sub-pixel (e.g., a sub-pixel that has a green color). The three sub-pixels 122, 124, 126 together form the respective pixel by occupying a single pixel-sized region from the collection of pixel-sized regions.

In some implementations, all pixel-sized regions within the first area 120 are occupied by the multiple pixels that each has the three sub-pixels. For example, the first area 120 may include only pixels that each include a single red sub-pixel, a single blue sub-pixel, and a single green sub-pixel. The first area 120 may extend between an outer boundary of an active region of a display panel and a boundary between the first area 120 and the second area 150.

The second area of multiple pixels 150 may include two different types of pixels. A first collection of pixels in the second area 150 includes a type of pixels that each have the same sub-pixel grouping as pixels in the first area 120. For example, each such pixel in the second area 150 includes a sub-pixel of a first color 154, a sub-pixel of a second color 156, and a sub-pixel of a third color 152A. A second collection of pixels in the second area 150 includes a type of pixels that each have a single sub-pixel. For example, each such pixel in the second area 150 includes a sub-pixel of the third color 152б, without a sub-pixel and corresponding LED of the first color or second color.

The second area 150 is shown as including, for each combination of a pixel from the first collection of pixels and a pixel from the second collection of pixels, two pixel-sized regions that are empty of any sub-pixel and empty of any corresponding LED (these empty pixel-sized regions being diagonal from each other. As such, the second area 150 may include multiple logical groupings that are each formed of four pixel-sized regions (two wide and two high, with the pixels diagonal from each other and the empty regions diagonal from each other), including two empty regions and two pixels, one from the first collection of pixels (having three sub-pixels), and one from the second collection of pixels (having a single sub-pixel).

In some implementations, the first color may be red, the second color may be blue, and the third color may be green, as described above. For example, the pixel near the top of the second area 150 that includes three constituent sub-pixels can include a single red sub-pixel 154, a single blue sub-pixel 156, and a single green sub-pixel 152A. The pixel at the top of the second area 150 that includes a single constituent sub-pixel can include a single green sub-pixel 152B.

An amount of pixels in the second area 150 that are from the first collection (having three sub-pixels each) may correspond to an amount of pixels in the second area 150 that are from the second collection (having a single sub-pixel each), meaning that the amounts are the same or in slight deviation from each other due to constraints imposed by a shape of the second area 150. An amount of pixel-sized regions in the second area 150 that are empty of any sub-pixel and empty of any corresponding LED may correspond to twice the amount of pixels that are from the first collection (having three sub-pixels each) and twice the amount of pixels that are from the second collection (having a single sub-pixel each). There may be no other types of pixels in the second area 150, such that the above-described proportional amounts are consistent across an extent of the second area 150.

In some implementations, the multiple pixels of the second area 150 include at least fifty pixels, one-hundred pixels, or five-hundred pixels, and are contained within a contiguous block of such pixels.

The second area 150 may drop 50% density of the sub-pixels of the third color with respect to the first area 120, and drop 75% density of the sub-pixels of the first color and 75% density of the sub-pixels of the second color with respect to the first area 120. Such a structure can achieve a Pentile-like quality of presentation, by having a higher pixel density in the third color with respect to a relatively-lower pixel density in the first color and the second color. This can provide high detail rendering capability and reduce a screen door effect, while permitting greater light transmissibility through the display to accommodate a sensor behind the display, while providing benefits of a higher LED density in a first area that spans a greater extent of the display device that does not obscure a sensor. Data lines and rows that drive the sub-pixels of the third color may be reduced by 50% using staggered connections to emissive pixels.

Figure 2:
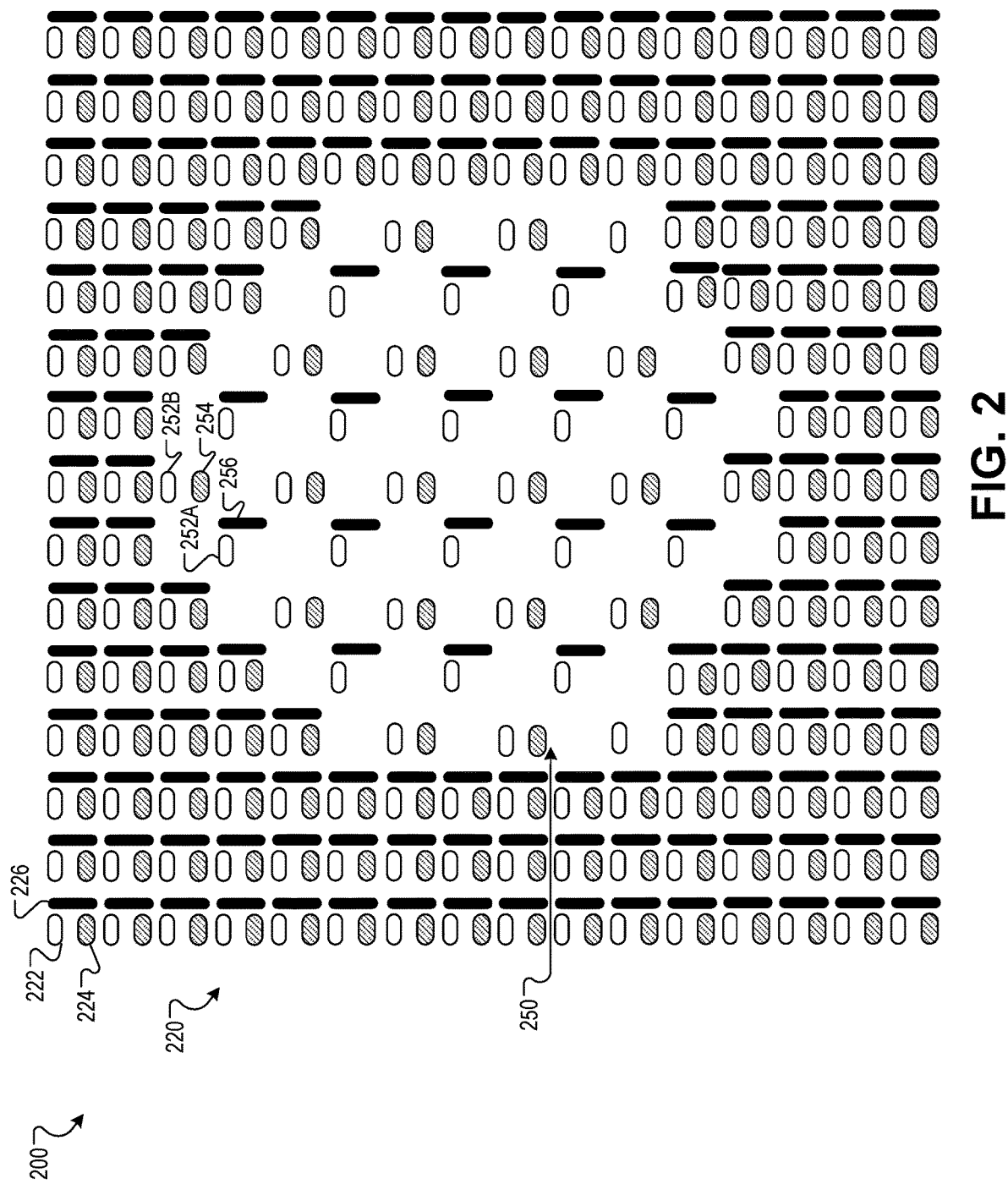
FIG. 2 is a conceptual diagram of a second display panel having two areas with different sub-pixel arrangements.

FIG. 2 is a conceptual diagram of a second display panel 200 having two areas with different, respective arrangements of sub-pixels. The second display panel 200 may be similar to the first display panel 100, with a first region 220 surrounding a circular second region 250, and the pixels in the first area 220 of FIG. 2 being same as the pixels in the first area 120 of FIG. 1. As described above with respect to FIG. 1, each of the pixels in the first area 220 of multiple pixels has a single sub-pixel of a first color 224, a single sub-pixel of a second color 226, and a single sub-pixel of a third color 222.

The second area of multiple pixels 250 includes two different types of pixels. A first collection of pixels in the second area 250 includes a type of pixels that each has two sub-pixels, including a sub-pixel of a first color 254 and a sub-pixel of a third color 252A (without a sub-pixel of the second color). A second collection of pixels in the second area 250 includes a type of pixels that each has two subpixels, including a sub-pixel of a second color 256 and a sub-pixel of the third color 252B (without a sub-pixel of the first color).

The second area 250 is shown as including, for each combination of a pixel from the first collection of pixels and a pixel from the second collection of pixels, two pixel-sized regions that are empty of any sub-pixel and empty of any corresponding LED. As such, the second area 150 may include multiple logical groupings that are each formed of four pixel-sized regions, including two empty regions and two pixels, one from the first collection of pixels (having two sub-pixels), and one from the second collection of pixels (having two sub-pixels).

In some implementations, the first color may be red, the second color may be blue, and the third color may be green, as described above. For example, the pixel at the very top of the second area 250 includes a single red sub-pixel 254 and a single green sub-pixel 252B. The pixel near the top of the second area 250 offset to the left includes a single blue sub-pixel 256 and a single green sub-pixel 252A.

An amount of pixels in the second area 250 that are from the first collection (having two sub-pixels each) may correspond to an amount of pixels in the second area 250 that are from the second collection (having a two sub-pixels each). An amount of pixel-sized regions in the second area 250 that are empty of any sub-pixel and empty of any corresponding LED may correspond to twice the amount of pixels that are from the first collection and twice the amount of pixels that are from the second collection. There may be no other types of pixels in the second area 250, such that the above-described proportional amounts are consistent across an extent of the second area 250.

In some implementations, the multiple pixels of the second area 250 include at least fifty pixels, one-hundred pixels, or five-hundred pixels, and are contained within a contiguous block of such pixels.

The second area 250 may drop 50% density of the sub-pixels of the third color with respect to the first area 220, and drop 75% density of the sub-pixels of the first color and 75% density of the sub-pixels of the second color with respect to the first area 220. Such a structure can achieve a Pentile-like quality of presentation, by having a higher pixel density in the third color with respect to a relatively-lower pixel density in the first color and the second color. This can provide high detail rendering capability and reduce a screen door effect. Data lines and rows that drive the sub-pixels of the third color may be reduced by 50% using staggered connections to emissive pixels.

Figure 3:
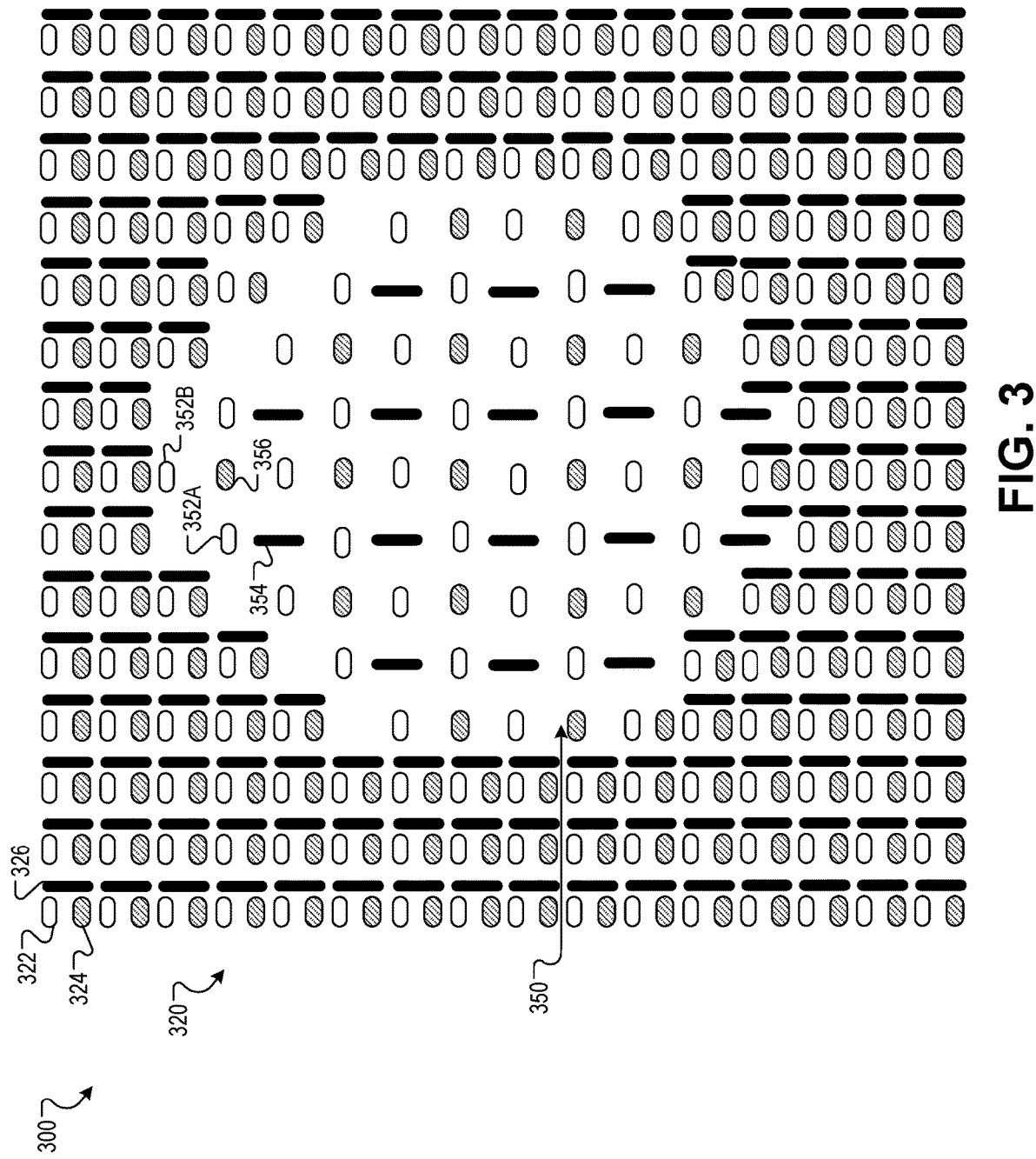
FIG. 3 is a conceptual diagram of a third display panel having two areas with different sub-pixel arrangements.

FIG. 3 is a conceptual diagram of a third display panel 300 having two areas with different, respective arrangements of sub-pixels. The third display panel 300 may be similar to the first display panel 100, with a first region 320 surrounding a circular second region 350, and the pixels in the first area 320 of FIG. 3 being same as the pixels in the first area 120 of FIG. 1. As described above with respect to FIG. 1, each of the pixels in the first area 320 of multiple pixels has a single sub-pixel of a first color 324, a single sub-pixel of a second color 326, and a single sub-pixel of a third color 322.

The second area of multiple pixels 350 includes three different types of pixels. A first collection of pixels in the second area 350 includes a type of pixels that includes a single sub-pixel of a first color 354 (without a sub-pixel of the second color and without a sub-pixel of the third color). A second collection of pixels in the second area 350 includes a type of pixels that includes a single sub-pixel of a second color 356 (without a sub-pixel of the first color and without a sub-pixel of the third color). A third collection of pixels in the second area 350 includes a type of pixels that includes a single sub-pixel of a third color 352 (without a sub-pixel of the first color and without a sub-pixel of the second color).

The second area 350 is shown as including, for each combination of a pixel from the first collection of pixels and a pixel from the second collection of pixels, two pixel from the third collection of pixels. As such, the second area 350 may include multiple logical groupings that are each formed of four pixel-sized regions, including four different pixels, one from the first collection of pixels, one from the second collection of pixels, and two from the third collection of pixels.

In some implementations, the first color may be red, the second color may be blue, and the third color may be green, as described above. For example, the pixel at the very top of the second area 350 includes a single green sub-pixel 362B. The pixel below it includes a single blue sub-pixel 356. The pixel offset to the left includes a single green sub-pixel 352A. The pixel below that pixel includes a single red sub-pixel 354.

An amount of pixels in the second area 350 that are from the first collection (having a single sub-pixel of the first color) may correspond to an amount of pixels in the second area 350 that are from the second collection (having a single sub-pixel of the second color). An amount of pixels in the second area 350 that are from the third collection (having a single sub-pixel of the third color) may correspond to twice an amount of pixels from the first collection and twice an amount of pixels from the second collection. In some implementations, there may be no other types of pixels in the second area 350, such that the above-described proportional amounts are consistent across an extent of the second area 350. In some implementations, there may be pixel-sized regions across the second area 350 that are empty of any sub-pixel and therefore empty of any LED.

In some implementations, the multiple pixels of the second area 350 include at least fifty pixels, one-hundred pixels, or five-hundred pixels, and are contained within a contiguous block of such pixels.

The second area 350 may drop 50% density of the sub-pixels of the third color with respect to the first area 320, and drop 75% density of the sub-pixels of the first color and 75% density of the sub-pixels of the second color with respect to the first area 220. Such a structure can achieve a Pentile-like quality of presentation, by having a higher pixel density in the third color with respect to a relatively-lower pixel density in the first color and the second color. This can provide high detail rendering capability and reduce a screen door effect. Data lines and rows that drive the sub-pixels of the third color may be reduced by 50% using staggered connections to emissive pixels.

As illustrated in FIG. 3, if the fine metal mask does not have to remain consistent across the display device, it is possible to distribute pixels in the first collection (each having a sub-pixel of the first color) and pixels in the second collection (each having a sub-pixel of the second color) in a more conventional RBGB arrangement to create a more-distributed emission intensity that can decrease a likelihood of noticing screen door effect structure. This may result in positioning of certain sub-pixels being offset from corresponding sub-pixels in the first area 320.

Such a configuration may involve breaking a pattern of the emissive area to shift the emission points, along with a commensurate shifting of the backplane circuitry. A reason to apply some shift is that, depending on the subpixels retained, there can be some boundary effects which may lead to a zone of the display that appears to have a bright edge and/or a dark edge. As such, it can be desirable to shift pixels so that spacing in a gap at the boundary becomes an intermediate spacing between the low density and the high density areas. FIG. 3 illustrates only shifts to the elongated subpixels, although all subpixels in the second area 350 may be shifted to balance gaps at the edges.

Figure 4:
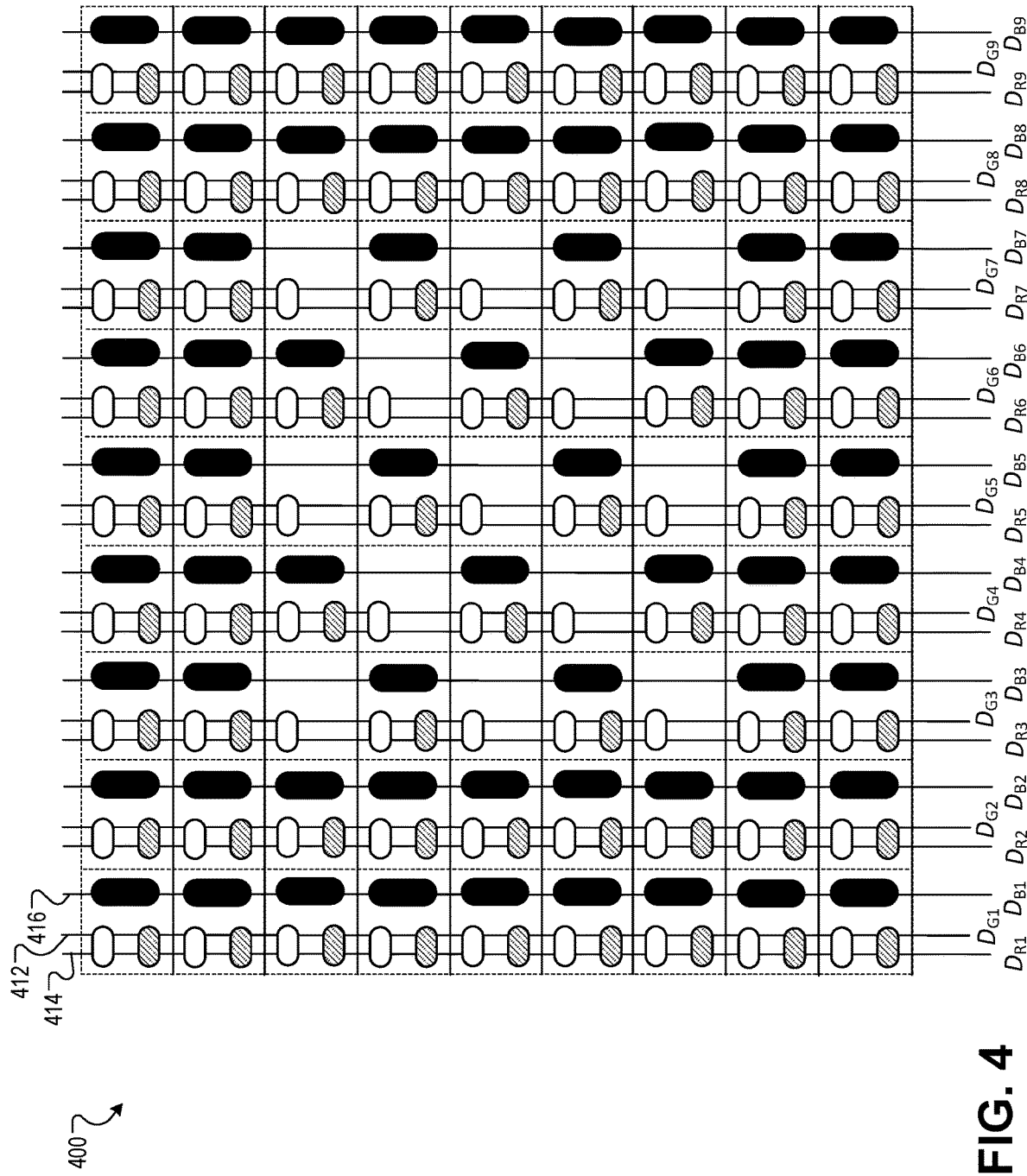
FIG. 4 is a conceptual diagram of a display panel having sets of three column data lines.

FIG. 4 is a conceptual diagram of a display panel 400 with sets of three column data lines. The first data line 414 may be for the first color, the second data line 416 may be for the second color, and the third data line 412 may be for the third color. Each of the column of pixels may be driven by a respective set of three column data lines. For example, FIG. 4 shows nine columns of pixels, and nine sets of three column data lines.

Figure 5:
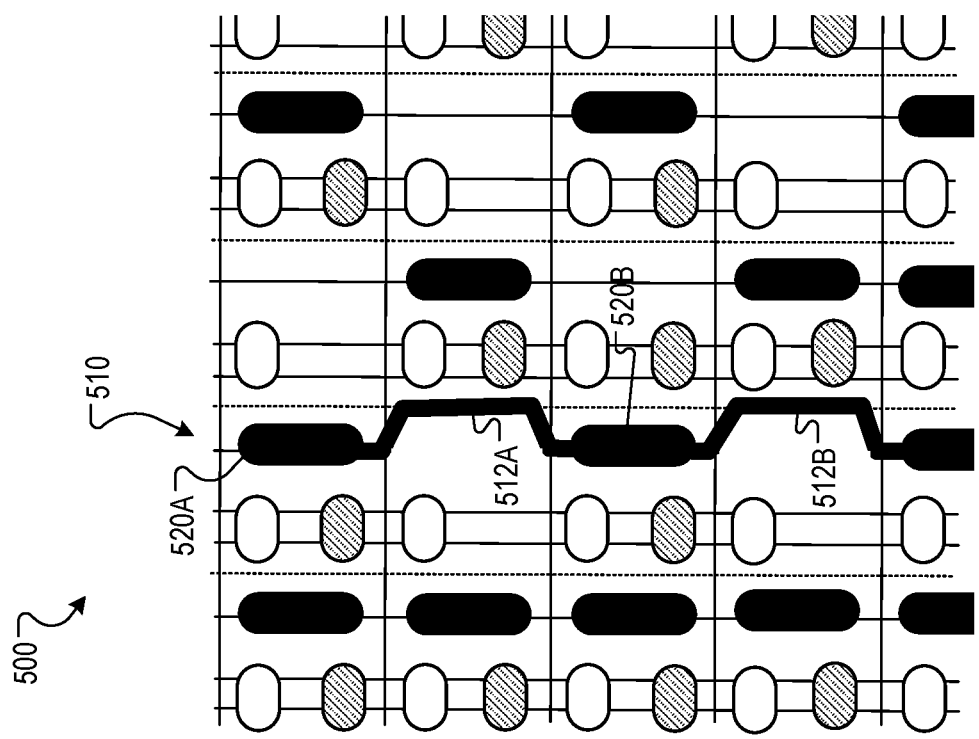
FIG. 5 is a conceptual diagram of a display panel having a non-linear column data line.

FIG. 5 is a conceptual diagram of a display panel 500 with a non-linear column data line 510. The non-linear column data line 510 includes non-linear segments 512A, 512B between sub-pixels 520A, 520B, where the non-linear segments 512A, 512B follow a non-linear path that reduces flare. The dashed lines denote a logical but imaginary boundary between pixels.

Figure 6:
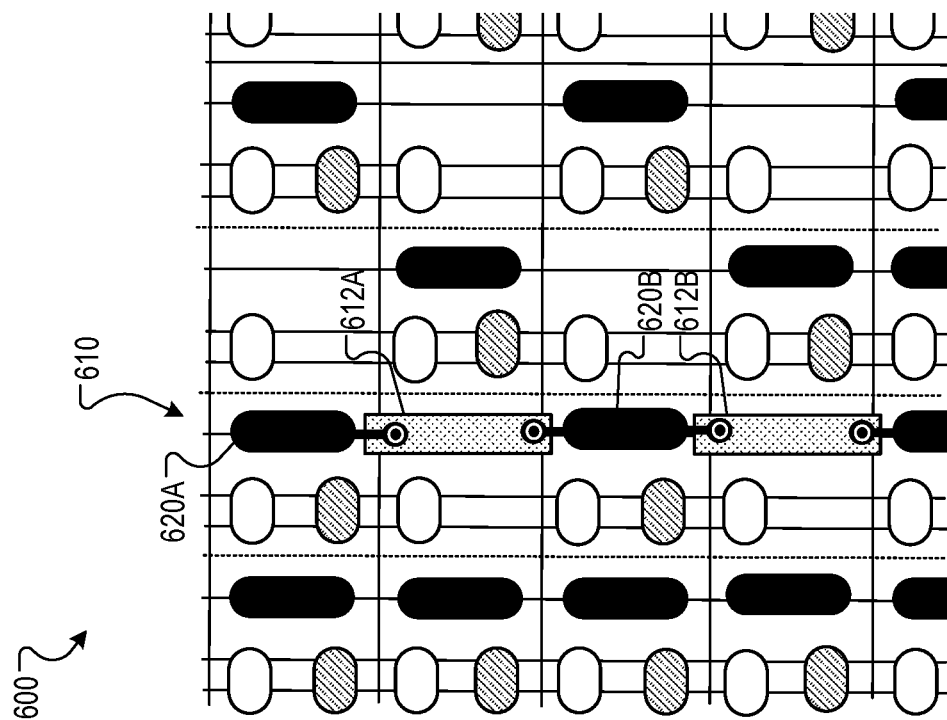
FIG. 6 is a conceptual diagram of a display panel having a semi-transparent column data line.

FIG. 6 is a conceptual diagram of a display panel 600 with a semi-transparent column data line 610. The semi-transparent column data line 610 includes at least partially transparent segments 612A, 612B between sub-pixels 620A, 620B, where the at least partially transparent segments 612A, 612B reduce light scattering. In some implementations, the segments 612A, 612B may be formed of Transparent Conducting Oxides such as Indium tin oxide.

Figure 7:
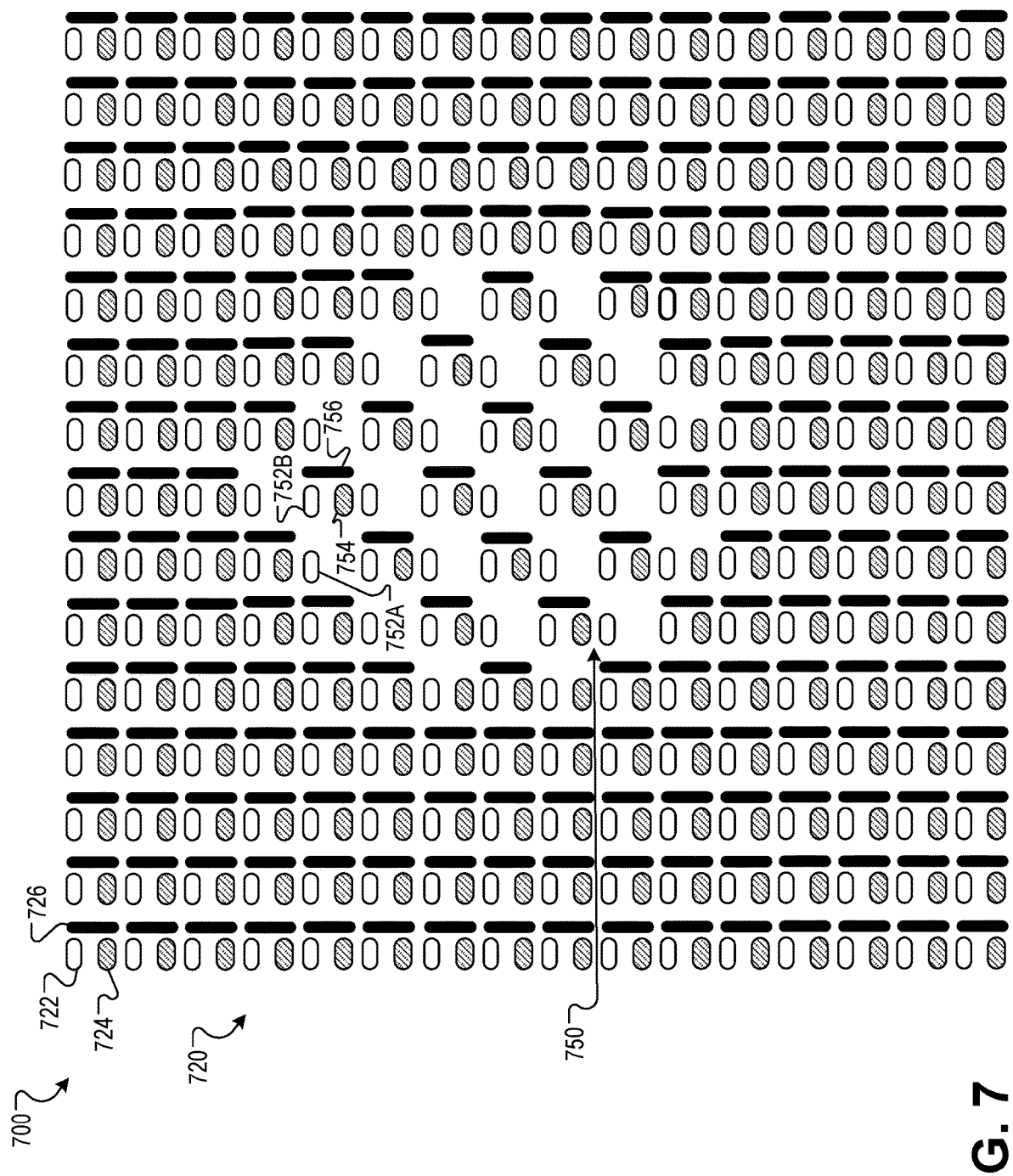
FIG. 7 is a conceptual diagram of a fourth display panel having two areas with different sub-pixel arrangements.

FIG. 7 is a conceptual diagram of a fourth display panel 700 having two areas with different sub-pixel arrangements. The fourth display panel 700 may be similar to the first display panel 100, with a first region 720 surrounding a circular second region 750, and the pixels in the first area 720 of FIG. 7 being same as the pixels in the first area 120 of FIG. 1. As described above with respect to FIG. 1, each of the pixels in the first area 720 of multiple pixels has a single sub-pixel of a first color 724, a single sub-pixel of a second color 726, and a single sub-pixel of a third color 722.

The second area of multiple pixels 750 may include two different types of pixels. A first collection of pixels in the second area 750 includes a type of pixels that each have the same sub-pixel grouping as pixels in the first area 720. For example, each such pixel in the second area 750 includes a sub-pixel of a first color 754, a sub-pixel of a second color 756, and a sub-pixel of a third color 752A. A second collection of pixels in the second area 750 includes a type of pixels that each have a single sub-pixel. For example, each such pixel in the second area 750 includes a sub-pixel of the third color 752B, without a sub-pixel and corresponding LED of the first color or second color.

The second area 750 is shown as including, for each pixel from the first collection of pixels, a pixel from the second collection of pixels. There may be no pixel-sized regions, within the second area 750, that are without any sub-pixel. As such, the second area 750 may include multiple logical groupings that are each formed of two pixel-sized regions (side-by-side), including one pixel from the first collection and one pixel from the second collection.

In some implementations, the first color may be red, the second color may be blue, and the third color may be green, as described above. For example, the pixel near the top of the second area 750 that includes three constituent sub-pixels can include a single red sub-pixel 754, a single blue sub-pixel 756, and a single green sub-pixel 752B. The pixel to its left includes a single a single green sub-pixel 752B.

An amount of pixels in the second area 750 that are from the first collection (having three sub-pixels each) may correspond to an amount of pixels in the second area 750 that are from the second collection (having a single sub-pixel each). There may be no other types of pixels in the second area 750, such that the above-described proportional amounts are consistent across an extent of the second area 750.

In some implementations, the multiple pixels of the second area 750 include at least fifty pixels, one-hundred pixels, or five-hundred pixels, and are contained within a contiguous block of such pixels.

The second area 750 may have a same density of sub-pixels of the third color with respect to the first area 720, and drop 50% density of the sub-pixels of the first color and 50% density of the sub-pixels of the second color with respect to the first area 720. Such a structure can achieve a Pentile-like quality of presentation, by having a higher pixel density in the third color with respect to a relatively-lower pixel density in the first color and the second color. This can provide high detail rendering capability and reduce a screen door effect, while permitting greater light transmissibility through the display to accommodate a sensor behind the display, while providing benefits of a higher LED density in a first area that spans a greater extent of the display device that does not obscure a sensor. Data lines and rows that drive the sub-pixels of the third color may be reduced by 50% using staggered connections to emissive pixels.

The display panels described above may transition from an RGB triplet arrangement to a subsampled pixel arrangement without a change to the deposition mask layers. While examples may depict an S-stripe arrangement, the same types of arrangements may apply to an RGB stripe arrangement. In the RGB stripe configuration, the low resolution may have full resolution for the sub-pixels of the third color but drop staggered groups of sub-pixels of the first and second color.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Thus, though particular embodiments of the subject matter have been described. These, and other embodiments, may fall within the scope of the following claims.

What is claimed is:

1. A display panel that forms a grid of pixel-sized regions, the display panel comprising:
a first area of pixel-sized regions from the grid of pixel-sized regions, the first area of pixel-sized regions:
including multiple pixels, having a first density of light emitting diodes (LEDs), and having an equal representation of LEDs of a first color, LEDs of a second color, and LEDs of a third color, with each pixel in the first area of pixel-sized regions being a first type of pixel that has, within a single pixel-sized region from the grid of pixel-sized regions:
(i) a first sub-pixel comprising an LED of the first color,
(ii) a second sub-pixel comprising an LED of the second color, and
(iii) a third sub-pixel comprising an LED of the third color; and
a second area of pixel-sized regions from the grid of pixel-sized regions, the second area of pixel-sized regions: bordering the first area of pixel-sized regions, having a second density of LEDs that is lower than the first density of LEDs, and having an unequal representation of LEDS of the first color, LEDs of the second color, and LEDs of the third color, wherein the second area of pixel-sized regions includes multiple four-pixel groupings of pixel-sized regions that are each four pixel-sized regions in size, being two pixel-sized regions high and two pixel-sized regions wide, each four-pixel grouping of pixel-sized regions including:
a pixel of the first type of pixel that has, within a single pixel-sized region from the grid of pixel-sized regions:
(i) a first sub-pixel comprising an LED of the first color,
(ii) a second sub-pixel comprising an LED of the second color, and
(iii) a third sub-pixel comprising an LED of the third color, wherein each pixel in the first area that is the first type of pixel occupies a same amount of space within the grid of pixel-sized regions as each pixel in the second area that is the first type of pixel; and
a pixel of a second type of pixel that has, within a single pixel-sized region from the grid of pixel-sized regions:
(i) a sub-pixel comprising an LED of the third color,
(ii) without any LED of the first color, and
(iii) without any LED of the second color.

2. The display panel of claim 1, wherein the first area of pixel-sized regions completely surrounds the second area of pixel-sized regions.

3. The display panel of claim 2, wherein the second area of pixel-sized regions includes at least fifty pixels.

4. The display panel of claim 1, wherein:
the first color is a red color;
the second color is a blue color; and
the third color is a green color.

5. The display panel of claim 1, wherein:
all pixel-sized regions within the first area are filled by the multiple pixels; and
a subset of pixel-sized regions within the second area are filled by pixels of the second area, such that some pixel-sized regions within the second area include no LED.

6. The display panel of claim 1, wherein the second area of pixel-sized regions has two LEDs of the third color for every LED of the first color and every LED of the second color.

7. The display panel of claim 6, wherein the third color is a green color.

8. The display panel of claim 7, wherein the first color is a red color and the second color is a blue color.

9. The display panel of claim 1, wherein the second area of pixel-sized regions has no pixel-sized region that is without any LED, such that all pixel-sized regions in the second area of pixel-sized regions has a pixel of the first type or the second type.

10. The display panel of claim 9, wherein an amount of pixels of the first type corresponds to an amount of pixels of the second type, within the second area of pixel-sized regions.

11. The display panel of claim 1, wherein the second area of pixel-sized regions includes a collection of pixel-sized regions that are each without any LED.

12. The display panel of claim 1, wherein a sensor is located underneath the second area of pixel-sized regions to receive or transmit electromagnetic energy through the second area of pixel-sized regions.

13. An electronic device, comprising: a display panel that forms a grid of pixel-sized regions, the display panel comprising:
   a first area of pixel-sized regions from the grid of pixel-sized regions, the first area of pixel-sized regions: including multiple pixels, having a first density of light emitting diodes (LEDs), and having an equal representation of LEDs of a first color, LEDs of a second color, and LEDs of a third color, with each pixel in the first area of pixel-sized regions being a first type of pixel that has, within a single pixel-sized region from the grid of pixel-sized regions:
      (i) a first sub-pixel comprising an LED of the first color,
      (ii) a second sub-pixel comprising an LED of the second color, and
      (iii) a third sub-pixel comprising an LED of the third color; and
   a second area of pixel-sized regions from the grid of pixel-sized regions, the second area of pixel-sized regions: bordering the first area of pixel-sized regions, having a second density of LEDs that is lower than the first density of LEDs, and having an unequal representation of LEDS of the first color, LEDs of the second color, and LEDs of the third color, wherein the second area of pixel-sized regions includes multiple four-pixel groupings of pixel-sized regions that are each four pixel-sized regions in size, being two pixel-sized regions high and two pixel-sized regions wide, each four-pixel grouping of pixel-sized regions including:
      a pixel of the first type of pixel that has, within a single pixel-sized region from the grid of pixel-sized regions:
         (i) a first sub-pixel comprising an LED of the first color,
         (ii) a second sub-pixel comprising an LED of the second color, and
         (iii) a third sub-pixel comprising an LED of the third color, wherein each pixel in the first area that is the first type of pixel occupies a same amount of space within the grid of pixel-sized regions as each pixel in the second area that is the first type of pixel; and
      a pixel of a second type of pixel that has, within a single pixel-sized region from the grid of pixel-sized regions:
         (i) a sub-pixel comprising an LED of the third color,
         (ii) without any LED of the first color, and
         (iii) without any LED of the second color.

14. The display panel of claim 13, wherein the second area of pixel-sized regions includes at least fifty pixels.

* * * * *